(12) United States Patent
Lambert et al.

(10) Patent No.: US 6,972,575 B2
(45) Date of Patent: Dec. 6, 2005

(54) CAPACITIVE PROXIMITY SENSOR

(75) Inventors: David K. Lambert, Sterling Heights, MI (US); Larry M. Oberdier, Royal Oak, MI (US); Ronald H. Haag, Clarkston, MI (US); Jeremy M. Husic, Washington, MI (US); Neil R. Aukland, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 410 days.

(21) Appl. No.: 10/158,699

(22) Filed: May 30, 2002

(65) Prior Publication Data

US 2002/0154039 A1    Oct. 24, 2002

Related U.S. Application Data

(63) Continuation of application No. 09/643,236, filed on Aug. 21, 2000, now Pat. No. 6,724,324.

(51) Int. Cl.[7] ............................................ G01R 27/26
(52) U.S. Cl. ...................... 324/658; 324/663; 318/264; 318/468
(58) Field of Search ...................... 340/870.32, 870.07; 361/170, 179, 181; 180/271; 701/49; 324/658, 324/659, 661; 318/264, 468

(56) References Cited

U.S. PATENT DOCUMENTS

| | | | |
|---|---|---|---|
| 4,351,016 A | 9/1982 | Felbinger | |
| 4,410,843 A | 10/1983 | Sauer et al. | |
| 4,453,112 A | 6/1984 | Sauer et al. | |
| 4,458,445 A | 7/1984 | Sauer et al. | |
| 4,831,279 A | 5/1989 | Ingraham | |
| 4,983,896 A | 1/1991 | Sugiyama et al. | |
| 5,027,552 A | 7/1991 | Miller et al. | |
| 5,081,406 A | 1/1992 | Hughes et al. | |
| 5,337,353 A | 8/1994 | Boie et al. | |
| 5,621,290 A | 4/1997 | Heller et al. | |
| 5,726,581 A | 3/1998 | Vrabish | |
| 5,801,340 A | 9/1998 | Peter | |
| 5,914,610 A * | 6/1999 | Gershenfeld et al. | 324/663 |
| 6,229,317 B1 * | 5/2001 | Barchuk | 324/663 |
| 6,294,784 B1 | 9/2001 | Schubring et al. | |
| 6,377,009 B1 * | 4/2002 | Philipp | 318/468 |
| 6,469,524 B1 * | 10/2002 | Oberdier | 324/688 |
| 2003/0085679 A1 * | 5/2003 | Bledin et al. | 318/264 |

OTHER PUBLICATIONS

Baxter, Larry, *Capacitive Sensors Design and Applications* (pp. 236-242 & 271-277) IEEE Press Marketing; 1997 by the Institute of Electrical and Electronics Engineers, Inc.

\* cited by examiner

*Primary Examiner*—Timothy Edwards, Jr.
(74) *Attorney, Agent, or Firm*—Scott A. McBain

(57) ABSTRACT

A capacitive sensor (30) for use with a automotive vehicle (200) having a power sliding door (202) has a flexible housing (44). The housing (44) has a first set of electrodes (12) and a second set of electrodes (14) interdigitally spaced from each other and a ground electrode (15) made from a flexible metallic braid.

14 Claims, 6 Drawing Sheets

CAPACITIVE PROXIMITY SENSOR

This application is a continuation in part of U.S. Ser. No. 09/643,236 now U.S. Pat. No. 6,724,324 filed on Aug. 21, 2000 and entitled Capacitive Proximity Sensor.

TECHNICAL HELD

The field of this invention relates to proximity sensors and more particularly, to capacitive proximity sensors.

BACKGROUND OF THE DISCLOSURE

Capacitive sensors using a single plate capacitive proximity detector are known. Typically, a balance is disrupted, for example, when a foreign object projects itself into the system, thereby altering a previous capacitance. The net result is a disruption of the balance. The balance can be achieved by using a bridge circuit with the proximity detecting capacitor in one arm of the bridge and a second capacitor, that has been adjusted to null the output of the bridge, in the other arm. Alternatively, the system can consist of two virtually identical oscillators that are independent of each other. Each of the two identical oscillators generates a signal with a frequency dependent on a capacitance, that is virtually identical to the other oscillator. Thus, when one capacitance is changed, the balance between the two frequencies is disrupted and the disruption can be measured, for example, by way of an electronic device.

While the known capacitive sensors adequately sense the proximity of an object, they do not adequately discriminate if an object is above or to the side or behind the sensor.

What is needed, is a capacitive proximity sensor that more clearly senses objects within a predetermined space within the proximity range of the sensor.

What is also needed, is a flexible elongated capacitive sensor that can sense the presence of an object along the space above the elongated strip while discriminating from objects at the side of or behind the elongated strip.

SUMMARY OF THE DISCLOSURE

In accordance with one aspect of the invention, a capacitive proximity sensor includes an elongated electrically non-conductive housing and a first electrode positioned in the housing and constructed for receiving a voltage signal. A second electrode is positioned in the housing and is constructed to generate an input signal to a detecting device and spaced from the first electrode. A ground electrode is positioned in the housing and has at least a portion thereof operably disposed in relation to the first and second electrodes to normally decrease the capacitive coupling directly between the first and second electrode such that a substantial amount of electric field lines between the first and second electrodes are laterally spaced from an axis between the first and second electrodes.

Desirably, the flexible insulative housing houses a plurality of the axially spaced first electrodes. A plurality of the second electrodes also axially are spaced within the housing and interdigitated with the plurality of first electrodes. The plurality of first and second electrodes are axially spaced apart from each other.

The ground electrode is a flexible conductive strip with a top side and bottom side. The ground electrode mounts the plurality of first and second electrodes on a top side thereof and is electrically insulated with respect to the plurality of electrodes.

The plurality of first electrodes are conductively connected together via a first conductive connection that extends along the bottom side of the ground electrode. The plurality of second electrodes are also conductively connected together via a second conductive connector that extends along the bottom side of the ground electrode.

In one embodiment, the plurality of first electrodes are made from a first single conductive wire that is formed into a plurality of repetitive convolutions on the top side of the ground electrode. The plurality of second electrodes is similarly made from a second single conductive wire that is formed into a plurality of repetitive convolutions on the top side of the ground electrode.

Desirably, the plurality of respective first electrodes are formed by the repetitive convolutions of the first wire being conductively connected together via substantially straight portions of the first wire that lies along the bottom side of the ground electrode. The plurality of respective second electrodes are formed by the repetitive convolutions of the second wire being conductively connected together via substantially straight portions of the second wire that lies along the bottom side of the ground electrode. The substantially straight portions of said first and second wires are laterally spaced apart along the bottom side of the ground electrode.

In one embodiment, the repetitive convolutions are in the form of a plurality of flattened coils of the respective wires. Each flattened coil overlays a plurality of other flattened coils and the coils laterally extend along a substantial width of topside of said ground electrode. In any form, the repetitive convolutions laterally extend a substantial portion of the width of the ground electrode.

Preferably, an amplifier is operably connected to the plurality of second electrodes near the proximate end of the housing. The output of the amplifier has a varying voltage dependent on the amount of capacitive coupling of the plurality of electrodes to the plurality of first electrodes.

In accordance with another aspect of the invention, a capacitive proximity sensor device includes a bendable elongated strip assembly having a capacitive structure mounted therein with a first electrode and a second electrode. An oscillator is coupled to the first electrode through a proximate end of the strip assembly to provide an alternating voltage signal to the first electrode. A detector is remotely spaced from the proximate end for receiving a capacitive signal from the second electrode. The amplifier is connected near a proximate end of the strip assembly to the second electrode. A low impedance electrical connection extends between the amplifier and the detector having insignificant capacitive coupling with any connection between the oscillator and the first electrode.

Preferably, the oscillator and the detector both are coupled to the elongated strip assembly via a single cable assembly that provides for the first electrical connection between the oscillator and the first electrode, and for the second electrical connection between the detector and the second electrode.

In accordance with yet another aspect of the invention, a capacitive proximity sensor includes a first electrode for receiving an electrical signal. A second electrode is disposed to generate a detection signal when virtually grounded conductive object is placed in a defined space relative to the first and second electrodes. The defined space is laterally spaced from between the first and second electrodes. The ground and shielding assembly is in proximity to the first and second electrodes to reduce coupling of said second electrode to the first electrode along a defined axis between said first and second electrode below said defined space.

Desirably, the ground and shielding assembly includes a ground electrode operably interposed between said first and second electrodes.

In accordance with another aspect of the invention, an automotive vehicle includes a power operated panel for example, a window, door, mini-van sliding door, or tailgate and a capacitive proximity sensor mounted on one of the power sliding panels and or an opening in the automotive vehicle for the power sliding panel. The capacitive proximity sensor is operably connected through a control to a motor which closes the power sliding panel to shut off, or reverse the motor when the capacitive proximity sensor senses a foreign object that changes the capacitive level of the capacitive sensor within a defined space near the sensor. Preferably, the capacitive proximity sensor is in the form of a flexible strip which is mounted along the opening and following a contoured edge of said opening to define an elongated space in proximity to the contoured edge.

BRIEF DESCRIPTION OF THE DRAWINGS

Reference now is made to the accompanying drawings in which:

FIG. 8 is a view of the sensor shown in FIG. 5 showing the use of a grounded cylinder moving with relation to the sensor;

FIG. 10 is a schematic view of the process of flattening a plurality of solenoid shaped coils onto the ground electrode to form the two sets of electrodes 12 and 14;

DETAILED DESCRIPTION OF THE PREFERRED EMBODIMENT

Figure 1:
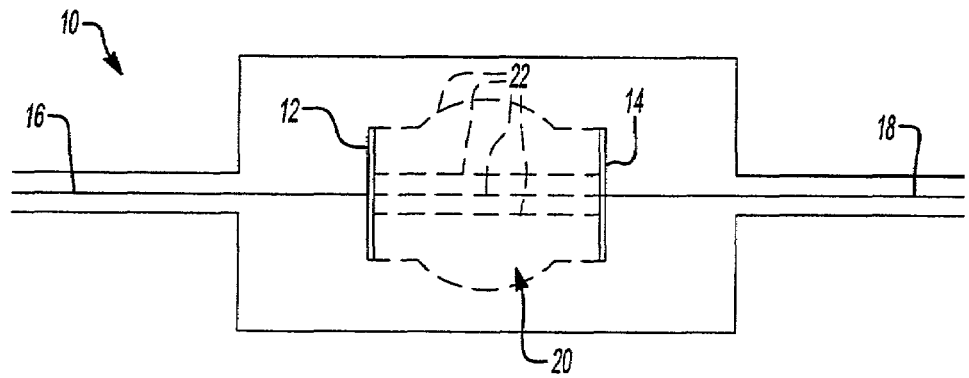
FIG. 1 is a schematic illustration of a prior art capacitor based sensor.

Referring now to FIG. 1, a known capacitive sensor arrangement 10 is schematically shown with a first electrode 12 and second electrode 14 each connected to input and output wires 16 and 18. As schematically shown, the capacitance between input and output wires 16 and 18 depends only on the capacitance between the two electrodes 12 and 14 which has field lines 22 that define the sensitive volume or space 20. A conducting object moved to within space 20 will change the capacitance between electrodes 12 and 14 while the presence of an object outside of space 20 will have negligible effect of the capacitance. As can be easily noted in this schematic, the E field represented by the field lines 22 lies primarily between the two electrodes 12 and 14. However, in most proximity sensing applications, it is impractical to have the sensitive space being directly interposed between the electrodes as shown in FIG. 1. The proximity sensors generally need to sense objects outside of the space directly between the electrodes 12 and 14.

Figure 2:
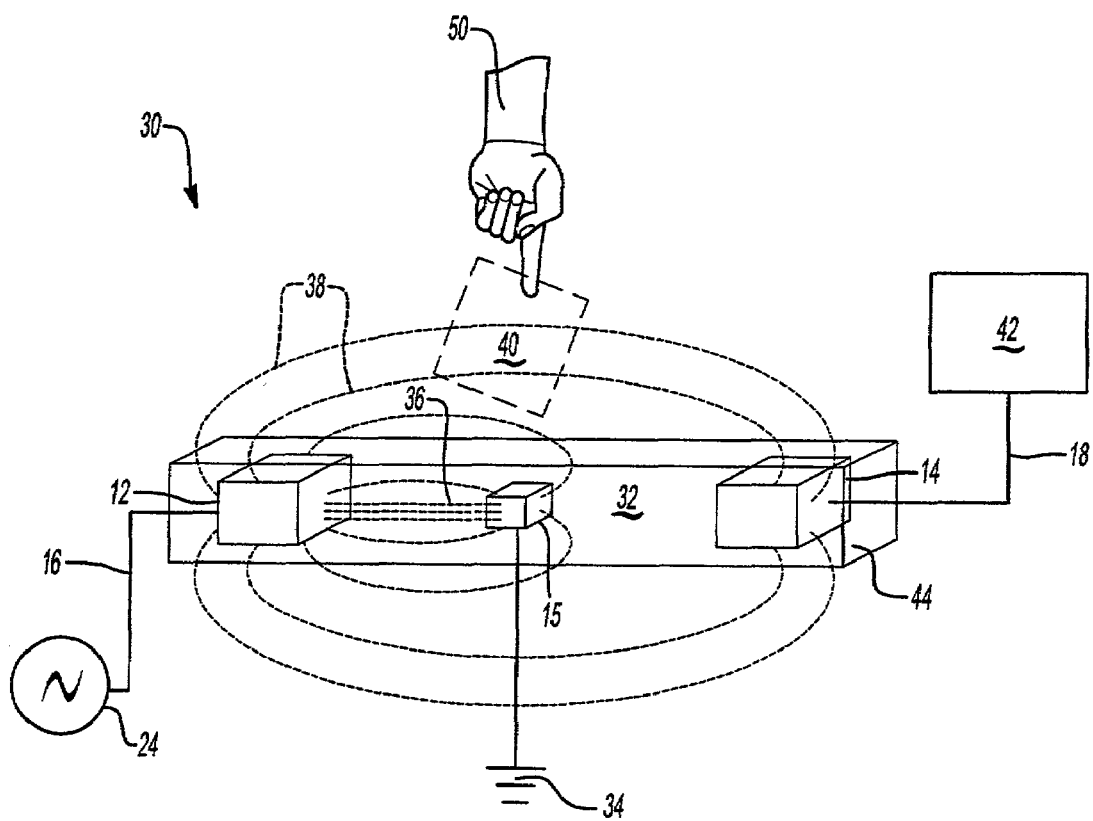
FIG. 2 is schematic illustration of one embodiment of the invention.

As such according to the invention, a schematic rendition of a capacitor sensor 30 is shown in FIG. 2 with the electrodes 12 and 14 spaced from each other. An alternating current source 24 is connected to the first electrode 12 to form an electric field. A grounded electrode 15 is positioned between the electrodes 12 and 14 along a common axis. Grounded electrode is operably connected to ground 34. The formed electric field has two major components, namely, a first component represented by field lines 36 between the first electrode 12 and grounded electrode 15 and a second component represented by remaining field lines 38 that extend from first electrode 12 to second electrode 14.

It can be appreciated that the electrode 14 is significantly uncoupled from electrode 12 at the space 32 lying directly on the axis directly between the electrodes 12 and 14 by the disposition of grounded electrode 15. It can also be appreciated that the presence of an object within the flux lines of 36 would have little effect on electrode 14 since the electrode 14 is already shielded by grounded electrode 15. Thusly, an object interposed directly between ground electrode 15 and either electrode 12 or 14 near the common axis of the three electrodes would also not effect the capacitance between electrode 12 and 14 and thus have little effect on electrode 14. It is also apparent from the illustration in FIG. 2 that the presence of a conducting object to the left of electrode 12 or to the right of electrode 14 would have little effect on electrode 14. In other words the sensitive space 40 of a capacitive proximity sensor is contained within the axial confines of the two electrodes 12 and 14 but is raised above the space 32 that is directly aligned between the two electrodes.

On the other hand, the presence of a grounded conductive object 50 such as a finger within the confines of flux lines 38 as illustrated would create a more significant change in the capacitance between the electrodes 12 and 14 and thus have an effect on electrode 14 which than can be adequately detected by a detector 42 connected to output wire 18.

The electrodes 12, 14 and 15 may all be housed within a housing or backing material 44. The housing material 44 may be made from an appropriate flexible di-electric such as extruded rubber or plastic material.

Figure 3:
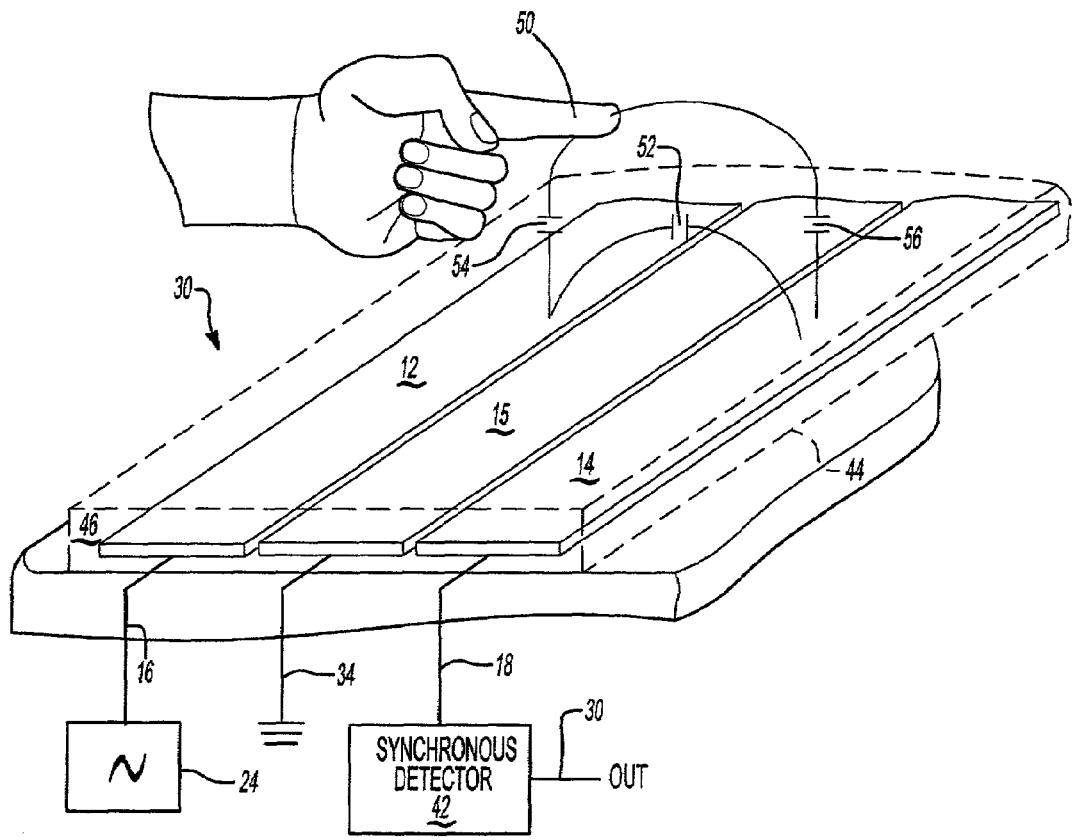
FIG. 3 is schematic illustration of another elongated strip version of the invention.

If an elongated space 40, such as along a door edge or along the edge of a trunk lid needs to be properly monitored, the electrodes 12, 14, and 15, may accordingly be elongated and formed into strips as illustrated in FIG. 3. The housing dielectric material 44 is mounted onto grounded sheet metal 46 that can be part of the door or trunk lid of an automobile. The sheet metal 46 can be used in other environments. Normally when an object 50 such as a person's finger is not present, the capacitance $C_{ac}$ 52 between the two electrodes 12 and 14 is at a certain calculated level. When an object 50 such as a person's finger intrudes into space 40 above the housing and between electrodes 12 and 14, the object 50 acts like a grounded electrode because the persons capacitance with the ground is quantum levels greater than the capacitance between the electrodes 12 and 14 and the object 50. In effect, the person's finger is grounded. The presence of the person's finger causes a decrease in the total calculated capacitance with electrode 14.

The grounded foreign object 50 changes the circuit to look like it has a Capacitance $C_{ab}$ 54 between electrode 12 and the object 50 and capacitance $C_{bc}$ 56 between the object 50 and electrode 14. The two capacitances $C_{ab}$ and $C_{bc}$ in effect couples electrode 14 to electrode 12 with a total decrease of capacitance to $C_{ac}$.

Furthermore, the frequency of the sinusoidal potential source 24 applied to electrode 12 is typically in the range 10–100 kHz or in the neighborhood thereof, but a much broader range of low frequencies such as 1 kHz to 1 MHz, and extending up to even higher frequencies could also be used within the scope of the invention.

In the present invention, the electric field with the stated frequency does not penetrate into the body much past the skin. Also, at the cited lower frequencies, the corresponding wavelength does not allow standing wave effects. For example, at 400 MHz the wavelength is 75 cm, which may be the length of the sensor 30 but 100 kHz the wavelength is 3 km. By having the sensor much shorter than the wavelength, the sensor is a very inefficient antenna and thus transmits and receives virtually no electromagnetic radiation at the operating frequency. By choosing operating frequency range between 10–100 kHz, the undesirable side effects are avoided. In other words, by utilizing a low frequency range under 1 MHz and preferably under 100 kHz, undesirable high frequency complications are averted. Also, electromagnetic interference is reduced at the lower frequencies.

A desired capacitance $C_{ac}$ (54) is measured by applying a sinusoidal potential or alternating voltage by a device such as an alternating current source 24 to electrode 12 via line 16. The electrode 14 is connected via line 18 to a detector 42 such as a synchronous detector.

The various mathematical calculations of $C_{ab}$, $C_{bc}$ and $C_{ac}$ depending on the distance of the object above the sensor 30, the effect of varying the gap between the electrodes 12 and 14, for a set width of the strip of electrodes are set forth in detail in previously cited U.S. Ser. No. 09/643,236 on pages 10–15 and is hereby incorporated by reference.

The demonstrated results of a sensor strip with 2.5 cm width has been shown to provide detection between 0.5 cm and 2 cm above the strip. Greater heights can be achieved at the cost of having sensor assembly strips of greater width using the construction as shown in FIG. 3. However, strips having a width of 2.5 cm or greater have limited application. Narrower and more flexible strips are desired in many applications but still need to maintain adequate detection heights of 2–2.5 cm away from the strip. As such, an alternate construction has been achieved by a novel geometry of the first and second electrodes and the ground electrode.

Figure 4:
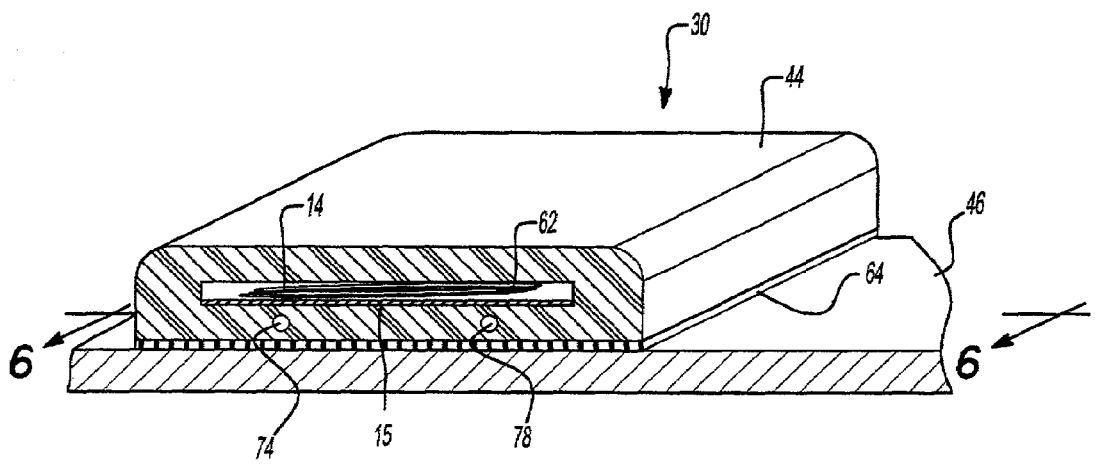
FIG. 4 is a perspective view of a modified embodiment for use as a mountable strip sensor.

Referring now to FIG. 4, an alternate narrower construction is shown that can have the proximity range of the above-described 2.5 cm wide front strip embodiment. For ease of understanding, like parts have the same numbers as previously mentioned. The sensor assembly 30 has an extruded rubber housing 44 that holds a ground electrode 15 in the form of a flexible conductive wire braid 62. Two sets of electrodes 12 and 14, each made with conductive wire with its own electrical insulation such as a plastic coating are mounted onto the ground electrode 15 axially spaced from each other. The housing may have an adhesive backing 64 that can adhere to the sheet metal 46.

Figure 5:
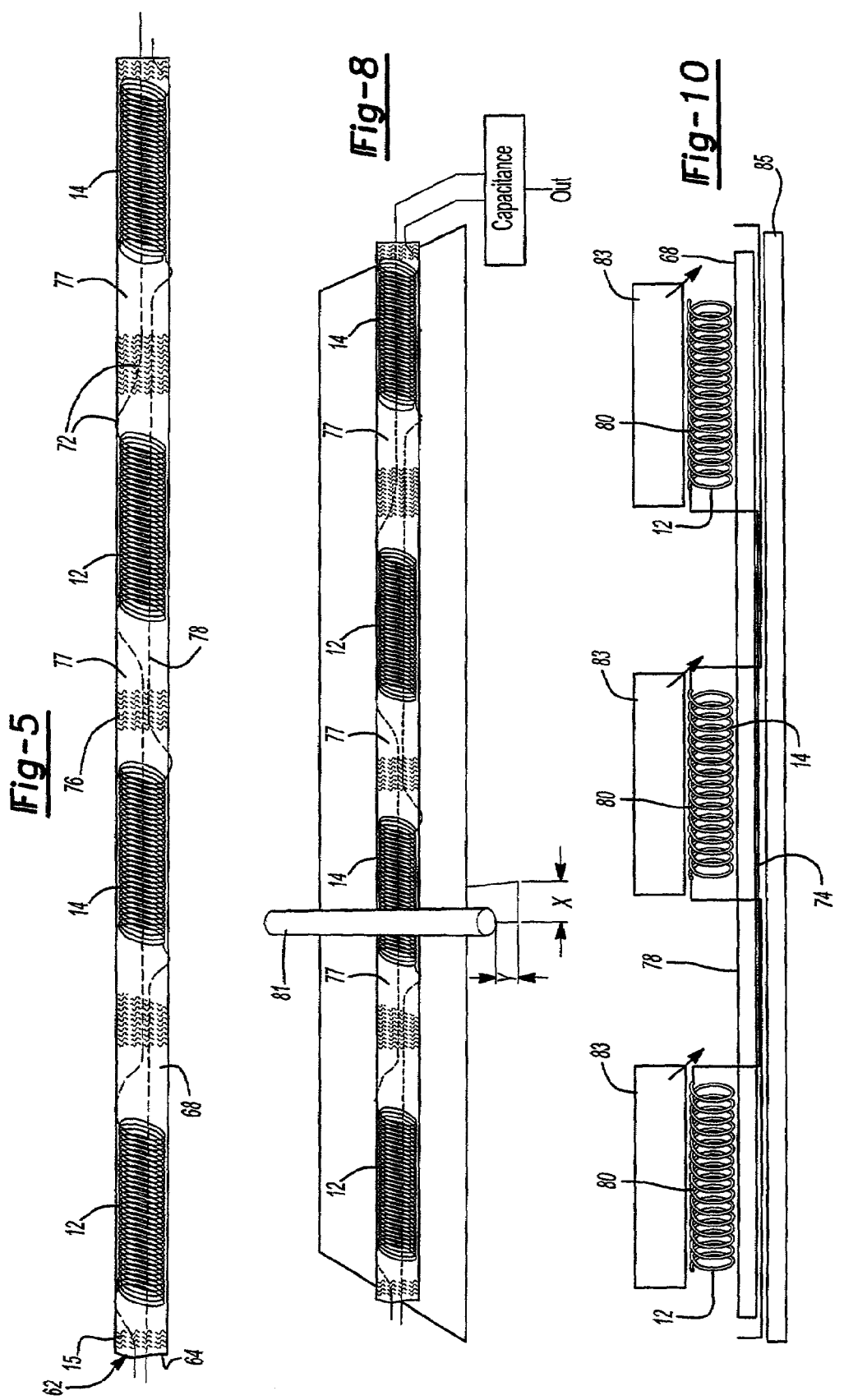
FIG. 5 is a plan view of the sensor shown in FIG. 4 with the housing removed to illustrate the positions of the two sets of electrodes and the ground electrode.

The electrode assembly can be described in more detail by referring to FIG. 5. The selected braid 62 is about 3 mm in width and less than 1 mm thick and is flexible in all three dimensions. It can be flexed up and down, flex within its own plane in a sideways fashion and twisted about its own axis. Such flexible metallic braid is well known and is commercially available from a plurality of known sources.

Figure 6:
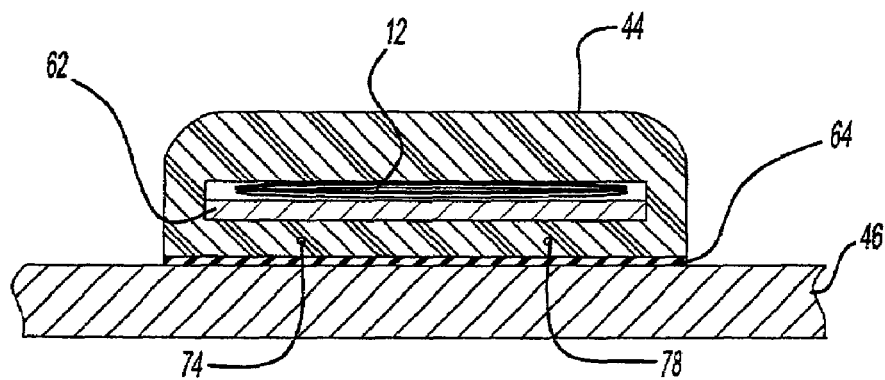
FIG. 6 is a side cross sectional view taken along lines 6—6 shown in FIG. 4.

As shown more clearly in FIGS. 5, 6 and 8 each electrode 12 and 14 is structurally identical and made from copper wire. The wire 72 for the electrode 12 has a straight section 74 at the bottom side 64 of braid 62 and then intrudes to the top side 68 where a plurality of coils 66 are formed as upright coils as shown in FIG. 10 and then flattened against the top side 68 of the braid 62 to form electrode 12. The electrode section is about 2.5 cm in length and is substantially the full width of the braid, namely about 3 mm. The wire then protrudes down to the lower surface where it forms another straight section 74 of about 8.5 cm in length where it then repeats and forms a sequential electrode 12.

Electrode 14 is formed in the same fashion with wire 76 forming straight section 78 and coiled electrodes 14 of the same dimensions as electrode 12. The individual electrodes 12 and 14 are interdigitated with each other with gaps 77 of about 3 cm between each sequential electrode 12 and 14.

The straight sections 74 and 78 are positioned near the outer periphery of the braid 62 such that when the housing is in place against the sheet metal 46, the straight sections are positioned almost twice as far as the distance to the braid or sheet metal as illustrated in FIG. 6. This geometrical structure minimizes the capacitance effect between the two straight sections 74 and 78.

Figure 7:
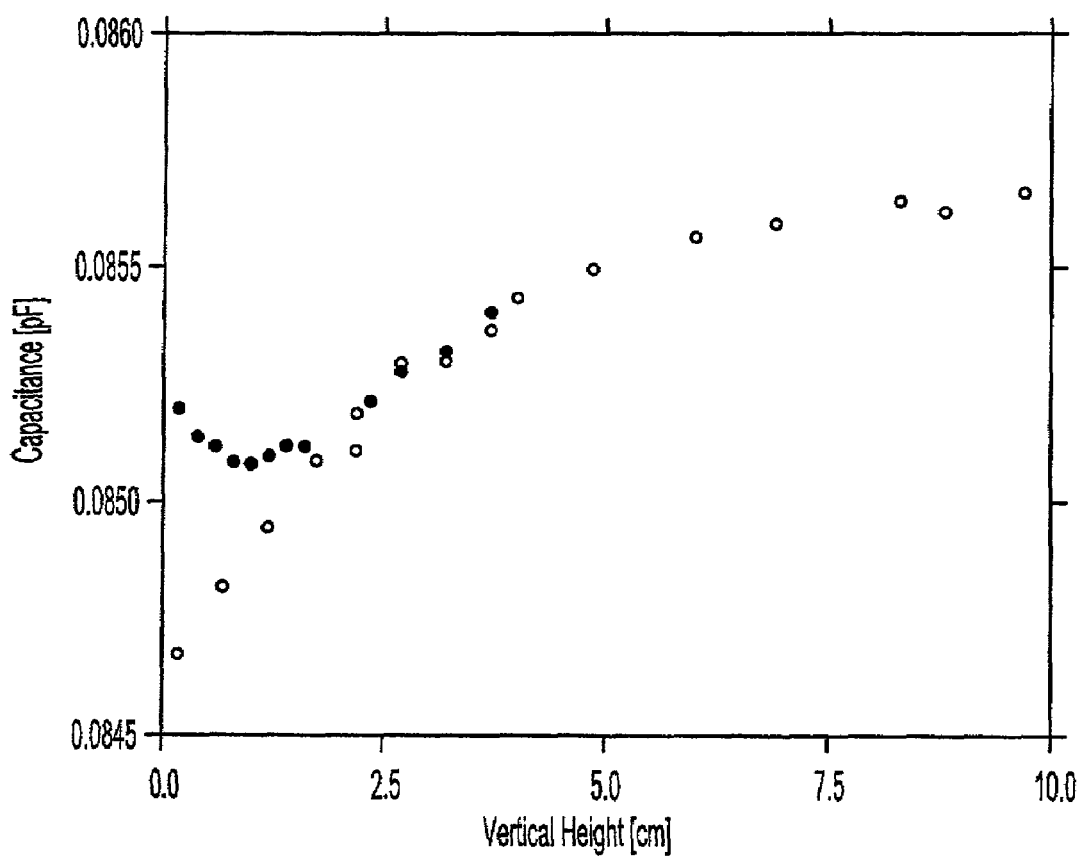
FIG. 7 is a chart that illustrates the capacitance of the sensor as a function of vertical height of a grounded conductive cylinder above the strip sensor.

The capacitance level has been found to be approximately 0.0856 picoFarads for this structure as shown in FIG. 7 when there is no object within 10 centimeters near the sensor strip. When a grounded cylinder rod 81 as illustrated in FIG. 8 is lowered toward the sensor 30, the capacitance is found to be lowered to almost 0.0850 picoFarads as shown in the data points in FIG. 7. This lowered capacitance level is achieved if the grounded cylinder is positioned directly over the braid at the center of a gap 77 between any two electrodes 12 and 14 as indicated by the black data points in FIG. 7. The capacitance can drop even further if the grounded cylinder is positioned over either electrode 12 and 14 as illustrated by the hollow circular data points shown in FIG. 7.

Figure 9:
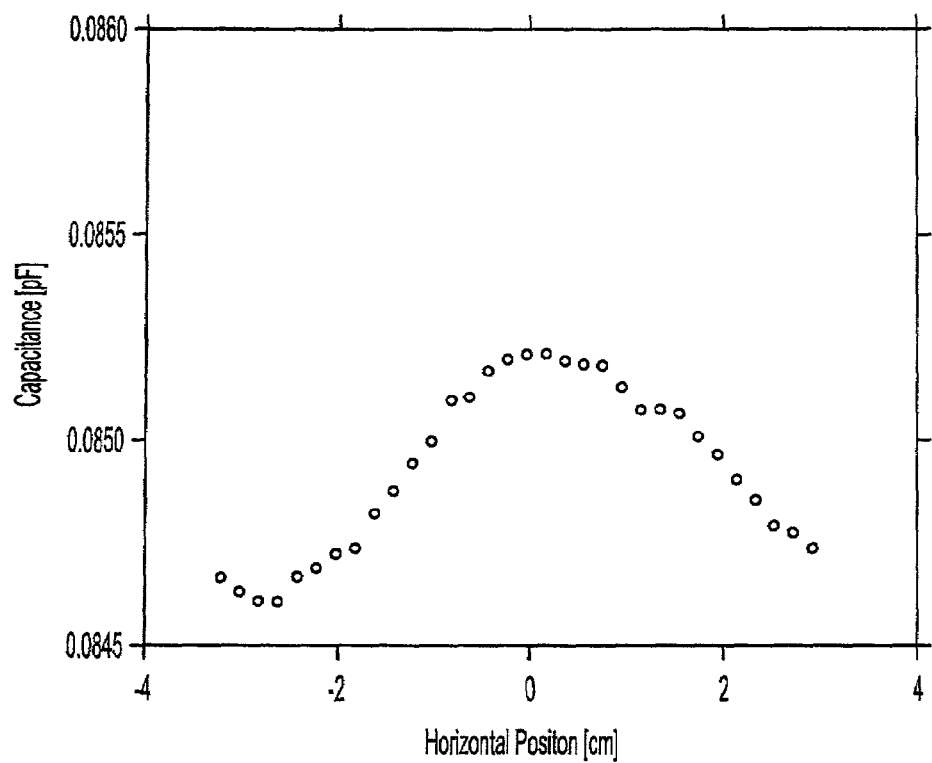
FIG. 9 is a chart that illustrates the capacitance of the sensor as a function of horizontal displacement of the grounded conductive cylinder when placed at a constant vertical height of 2.5 cm above the sensor.

As can be determined from FIG. 7, as the cylinder is moved axially along the sensor 30 at about 1 cm above the electrodes 12 and 14 and grounded electrode 15, the dependence of the capacitance level on proximity changes. As more clearly illustrated in FIG. 9, the capacitance level of 0.0850 pF is the largest capacitance level as the rod 81 is axially moved therealong at 2.5 cm above the sensor. As one can readily determine from the data shown in FIG. 7, the sensor significantly changes its capacitance level when a grounded cylinder rod is lowered to within 2.5 cm no matter where the cylinder is located axially along the capacitive sensor 30.

Because of the relatively flat shape of the sensor, the space most sensitive to detection also lies directly above the sensor as shown in FIG. 6. The spaces to the sides are not as sensitive and the space underneath, due to the sheet metal 46 shielding effect, does not affect the sensor 30.

The method of making the electrodes 12 and 14 have been found to be expedited if the electrodes section is first formed by forming a plurality of upright coils 80 such as solenoid type coil, as shown in FIG. 10. After the coils 80 are formed, the coils are then flattened by presses 83 toward the braid which is secured on a platen 85 during the pressing operation. The housing 44 is then extruded or otherwise formed over the flattened coils 80 (now formed electrodes 12 and 14) to retain the shape of the coils. Optional adhesives or mechanical means such as thread may also retain the coils in the pressed and flattened condition.

Figure 11:
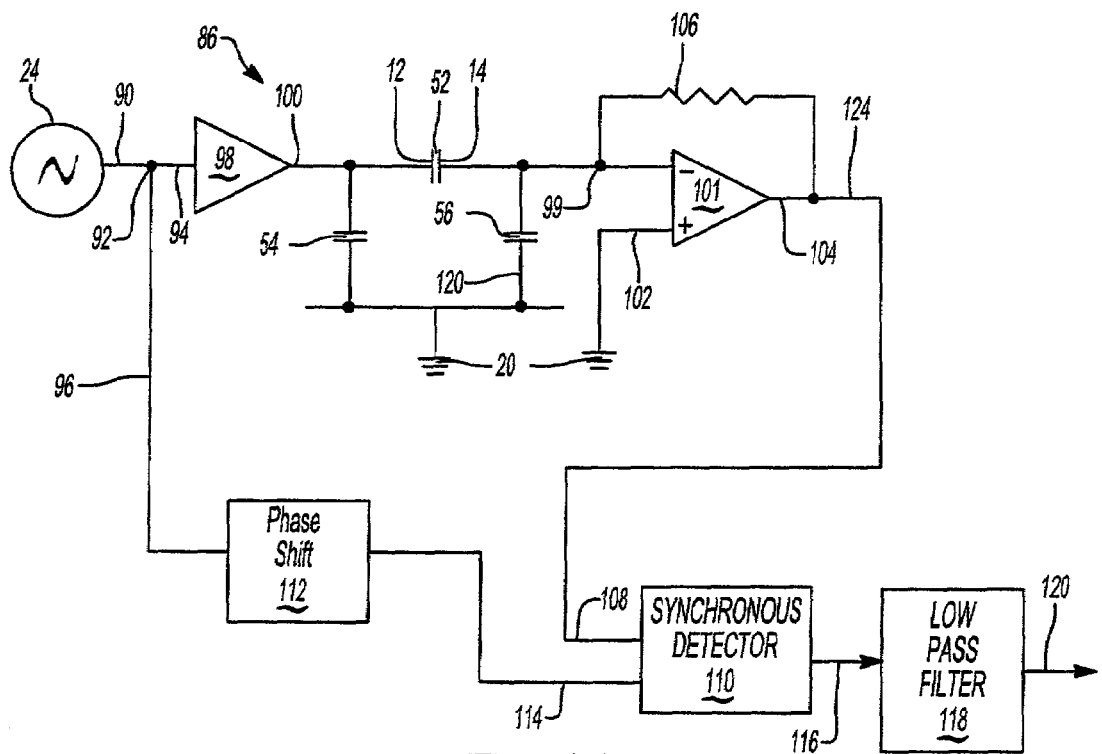
FIG. 11 is a schematic view of one circuit used with the proximity sensor.

The circuit used to sense the output from electrode 14 is then set to detect a capacitance signal of about 0.851 pF such that it signifies the presence of a ground such a person's hand or finger within 2.5 cm above the electrodes. FIG. 11 shows a schematic diagram of a circuit constructed to detect such capacitance signals. The alternating source of power 24 generates a sinusoidal voltage within the above mentioned frequency range to line 90. At junction point 92, the sinusoidal voltage is connected to a first branch 94 and a second branch 96. The first branch leads to a buffer amplifier 98 that has a low output impedance. The output line 100 of the buffer amplifier is virtually unaffected by independent changes in shunt capacitance 54 that is not related to capacitance $C_{ac}$ 52 between the first electrode 12 and second electrode 14. The shunt capacitance 54 is caused by the finger 50 which acts as a virtual ground 20. The virtual ground 20 of the finger 20 also forms a second shunt capacitance 56 with the second electrode 14.

The electrode 14 is connected to virtual ground 99 of an operational amplifier 101. The non-inverting input point 102 of the amplifier 101 is coupled to ground. The output point 104 and the virtual ground 99 has a feedback resistance 106 therebetween. Output 104 is connected to one input 108 of a synchronous detector 110.

The second branch 96 leads to a ninety-degree phase shifter 112 wherein the sine wave is transformed into a square wave that is ninety degrees phase shifted relative to the sine wave. The square wave is then fed into a second lead 114 into the synchronous detector which serves as a reference input. The synchronous detector 110 generates an output 116 that further passes through a low pass filter 118 wherein undesirable high frequency noise is filtered out. An output 120 of the low pass filter may be utilized for an indication of the change of $C_{ac}$ below the predetermined level as follows.

The operational amplifier 101 provides a current-to-voltage conversion mode with the inverting input at virtual ground 99. The current generated by shunt capacitance 54 also goes to ground. As with capacitance in general, the current output of capacitance $C_{ac}$ 52 is ninety degrees out of phase with the sine wave alternating source 24. Thus the phase shifter 112 brings both signals back into phase and thus can be compared and determined based on the effective change of capacitance $C_{ac}$ independent of the variable shunt capacitances 54 and 56.

Figure 12:
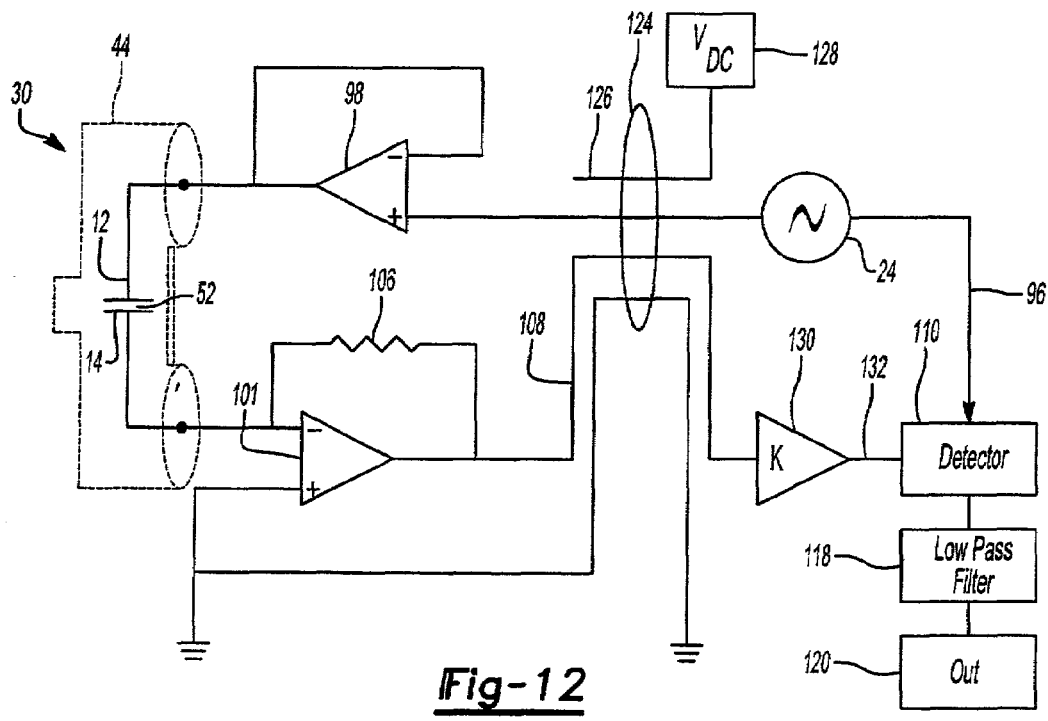
FIG. 12 is a schematic view of a modified circuit used with the proximity sensor that incorporates unshielded cabling between the sensor and the oscillator and detectors.

As shown in FIG. 12, the sensor 30 is indicated with the extruded housing 44 indicated schematically by phantom lines. The capacitor 52 formed between electrodes 12 and 14 is indicated to be within the extruded housing. While the extruded housing 44 must be placed at the area of sensing and bend so that it can conform to the perimeter of the opening in the vehicle body that needs to be sensed, such as at the edge of a power sliding door, or at the lip of a trunk in an automotive vehicle, the controlling elements such as the detector 110, low pass filter 118 and oscillator 24 are usually placed elsewhere in a more protective place such as under the instrument panel.

The signal that comes from the sensor 30 from output electrode 14 must make it back to the controlling elements 110, 118 and 120 without outside interference such as external capacitances. One way of accomplishing this is to make the cable 124 that provides the connection between the sensor 30 and the controlling elements a pair of shielded coaxial cables.

Another way to provide an output signal to the controlling elements 110, 118 and 120 is to provide an operational amplifier 101 at the output end with the resistance feedback 106. The output signal 108 is converted into a low impedance signal which provides for a relatively noise free signal through the schematically represented cable 124 which can now be an unshielded cable. A direct voltage source 128 can also be provided through cable 124 in line 126 and be connected to power the operational amplifiers 98 and 101. An operational amplifier 130 with gain K may amplify the output signal 108 and feed the amplified output signal 132 to detector 110. The detector 110 in this embodiment may have a built-in phase shifter to synchronize the signals 96 and 132. The output signal 116 is then similarly passed through the low pass filter 118 and the output signal 120 is then used to detect an object within the 2.6 cm proximity above the sensor.

Figure 13:
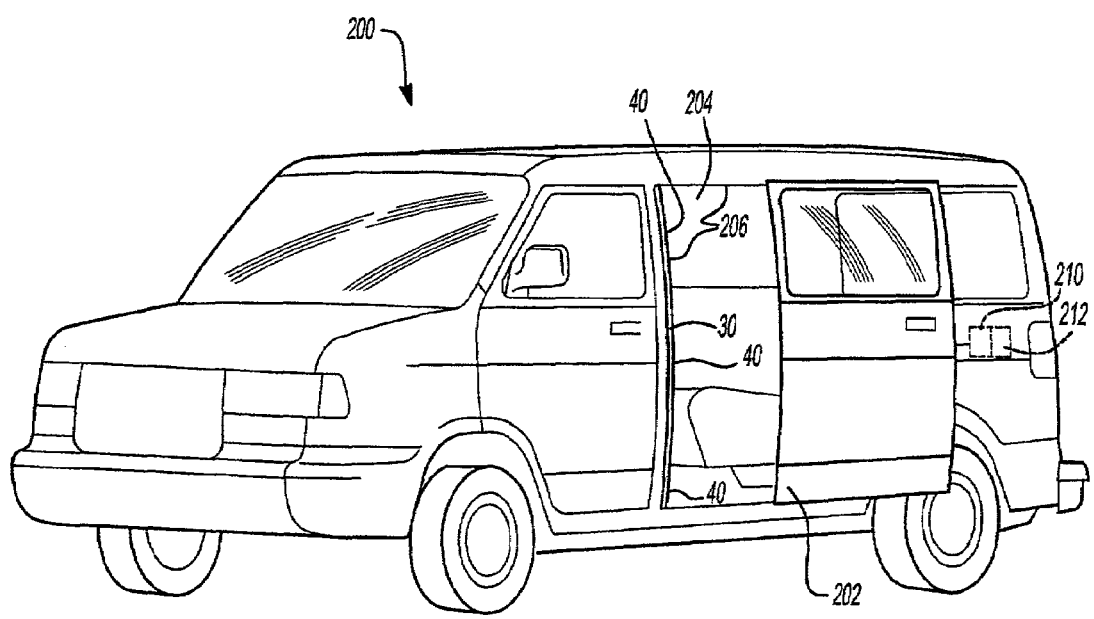
FIG. 13 illustrates the use of the proximity sensor with a power side door of a mini-van.

As shown in FIG. 13, one foreseen environment for this capacitance sensor is for an automotive vehicle such as a mini-van 200 that has a power sliding side door 202. The opening area 204 may be lined with the sensor 30 about the exposed edge 206. The flexibility of the sensor allows it to follow any contours of the body opening along any contour of edge 206 with ease. The power sliding door is opened and closed by a conventional motor 210 through the use of conventional cable structure. The electric circuit 86 is operably connected to the motor 210 via a controller 212 to reverse the motor as it is closing the door if a hand or finger 50 is sensed anywhere along the defined contoured space 40 in proximity to the edge 206.

Variations and modifications are possible without departing from the scope and spirit of the present invention as defined by the appended claims.

What is claimed is:

1. A capacitive proximity sensor characterized by:
   an elongated electrically non-conductive housing;
   a first electrode positioned in said housing and constructed for receiving a voltage signal;
   a second electrode positioned in said housing and being constructed to generate an input signal to a detecting device and spaced from said first electrode;
   a ground electrode positioned in said housing and having at least a portion thereof operably disposed in relation to said first and second electrodes to normally decrease the capacitive coupling directly between the first and second electrode such that a substantial amount of electric field lines between the first and second electrodes are laterally spaced from an axis between the first and second electrodes.

2. A capacitive proximity sensor as defined in claim 1 further characterized by:
   an amplifier operably connected to said second electrode near a proximate end of said housing;
   said output of said amplifier having varying voltage dependent of the amount of capacitive coupling of the second electrode to the first electrode.

3. A capacitive proximity sensor as defined in claim 1 further characterized by:
   a plurality of said first electrodes axially spaced along said housing;
   a plurality of said second electrodes axially spaced along said housing and interdigitated with said plurality of first electrodes;
   said plurality of first and second electrodes being axially spaced apart from each other;
   said ground electrode being a flexible conductive strip with a top side and bottom side;

said ground electrode mounts said plurality of first and second electrodes on a top side thereof and is electrically insulated with respect to the plurality of electrodes;

said plurality of first electrodes being conductively connected together via a first conductive connection that extends along the bottom side of said ground electrode;

said plurality of second electrodes being conductively connected together via a second conductive connector that extends along the bottom side of said ground electrode.

4. A capacitive proximity sensor as defined in claim 3 further characterized by:

said plurality of first electrodes being made from a first single conductive wire that is formed into a plurality of repetitive convolutions on said top side of said ground electrode to form each of said first electrodes;

said plurality of second electrodes being made from a second single conductive wire that is formed into a plurality spaced convolutions on said top side of said ground electrode to form each of said second electrodes;

said plurality of respective first electrodes formed by the repetitive spaced convolutions of said first wire being conductively connected together via substantially straight portions of said first wire along said bottom side of said ground electrode;

said plurality of respective second electrodes formed by the repetitive convolutions of said second wire being conductively connected together via substantially straight portions of said second wire along said bottom side of said ground electrode;

said substantially straight portions of said first and second wires being laterally spaced apart along the bottom side of said ground electrode.

5. A capacitive proximity sensor as defined in claim 4 further characterized by:

said repetitive convolutions laterally extending a substantial portion of the width of the ground electrode.

6. A capacitive proximity sensor as defined in claim 4 further characterized by:

an amplifier operably connected to said plurality of second electrodes near the proximate end of said housing;

said output of said amplifier having a varying voltage dependent on the amount of capacitive coupling of the plurality of second electrodes to the plurality of first electrodes.

7. A capacitive proximity sensor as defined in claim 4 further characterized by:

said repetitive convolutions being a plurality of flattened coils of said respective wires.

8. A capacitive proximity sensor as defined in claim 7 further characterized by:

each flattened coil overlaying a plurality of other flattened coils and said coils laterally extending along a substantial width of topside of said ground electrode.

9. A capacitive proximity sensor device characterized by:

a bendable elongated strip assembly having a capacitive structure mounted therein with a first electrode and a second electrode;

an oscillator coupled to said first electrode through a proximate end of said strip assembly to provide an alternating voltage signal to said first electrode;

a detector remotely spaced from said proximate end for receiving a capacitive signal from said second electrode;

an amplifier connected near a proximate end of said strip assembly to said second electrode;

a low impedance electrical connection extending between said amplifier and said detector having insignificant capacitive coupling with any connection between said oscillator and said first electrode.

10. A capacitive proximity sensor as defined in claim 9 further characterized by:

said oscillator and said detector both being coupled to said elongated strip assembly via a single cable assembly that provides for said first electrical connection between said oscillator and said first electrode, and for said second electrical connection between said detector and said second electrode.

11. A capacitive proximity sensor as defined in claim 9 further characterized by:

a plurality of said first electrodes axially spaced along said housing;

a plurality of said second electrodes axially spaced along said housing and interdigitated with said plurality of first electrodes;

said plurality of first and second electrodes being axially spaced apart from each other;

a ground electrode being a flexible conductive strip with a top side and bottom side;

said ground electrode mounts said plurality of first and second electrodes on a top side thereon and is electrically insulated with respect to the electrodes;

said plurality of first electrodes being conductively connected together via a first conductive connection that extends along the bottom side of said ground electrode;

said plurality of second electrodes being conductively connected together via a second conductive connector that extends along the bottom side of said ground electrode.

12. An automotive vehicle comprising:

a power operated panel;

a flexible capacitive proximity sensor operating on low frequencies mounted on one of the power operated panel and an opening in said vehicle for said power sliding panel;

said capacitive proximity sensor operably connected through a control to a motor which closes said power operated panel to reverse said motor when said capacitive proximity sensor senses a foreign object that changes the capacitive level of said sensor within a defined space near said sensor, said capacitive sensor being housed within an elongated electrically non-conductive housing;

a first electrode positioned in said housing and constructed for receiving a voltage signal;

a second electrode positioned in said housing and being constructed to generate an input signal to a detecting device and spaced from said first electrode;

a ground electrode positioned in said housing and having at least a portion thereof operably disposed in relation to said first and second electrodes to normally decrease the capacitive coupling directly between the first and second electrode such that a substantial amount of electric field lines between the first and second electrodes are laterally spaced from an axis between the first and second electrodes.

13. An automotive vehicle as defined in claim 12, further comprising:

said capacitive proximity sensor being in the form of a flexible strip which is mounted along the opening and following a contoured edge of said opening to define an elongated space in proximity to said contoured edge.

14. A automotive vehicle as defined in claim 12 further comprising:
- a plurality of said first electrodes axially spaced along said housing;
- a plurality of said second electrodes axially spaced along said housing and interdigitated with said plurality of first electrodes;
- said plurality of first and second electrodes being axially spaced apart from each other;
- said ground electrode being a flexible conductive strip with a top side and bottom side;
- said ground electrode mounts said plurality of first and second electrodes on a top side thereof and is electrically insulated with respect to the plurality of electrodes;
- said plurality of first electrodes being conductively connected together via a first conductive connection that extends along the bottom side of said ground electrode;
- said plurality of second electrodes being conductively connected together via a second conductive connector that extends along the bottom side of said ground electrode.

\* \* \* \* \*